United States Patent [19]

Baldi

[11] Patent Number: 4,897,375
[45] Date of Patent: Jan. 30, 1990

[54] PROCESS OF PREPARING CATALYTIC BRASS

[75] Inventor: Alfonso L. Baldi, Wynnewood, Pa.

[73] Assignee: Alloy Surfaces Company, Inc., Wilmington, Del.

[21] Appl. No.: 479,211

[22] Filed: Mar. 28, 1983

Related U.S. Application Data

[63] Continuation-in-part of Ser. No. 359,212, Mar. 18, 1982, and a continuation-in-part of Ser. No. 302,979, Sep. 17, 1981, and a continuation-in-part of Ser. No. 281,405, Jul. 8, 1981, Pat. No. 4,708,913, and a continuation-in-part of Ser. No. 311,621, Oct. 15, 1981, and a continuation-in-part of Ser. No. 242,350, Mar. 10, 1981, Pat. No. 4,464,430.

[51] Int. Cl.$^4$ .................... B01J 21/04; B01J 23/06; B01J 23/72
[52] U.S. Cl. .................... 502/301; 502/342; 518/713
[58] Field of Search ............ 502/301, 342; 518/713

[56] References Cited

U.S. PATENT DOCUMENTS

| | | |
|---|---|---|
| 3,939,097 | 2/1976 | Takeoka et al. |
| 4,043,945 | 8/1977 | Fukui et al. |
| 4,154,705 | 5/1979 | Baldi et al. ................ 502/301 |
| 4,349,464 | 9/1982 | Wainwright et al. ........ 502/301 |

FOREIGN PATENT DOCUMENTS 51-55780  5/1976  Japan.

Primary Examiner—W. J. Shine
Attorney, Agent, or Firm—Connolly & Hutz

[57] ABSTRACT

Self-supporting web of brass or similar cupreous metal is catalytically activated by diffusing aluminum into its surface at low temperatures and then leaching out some of that aluminum with dilute mineral acid, preferably $HNO_3$, or ammonium persulfate. Resulting catalyst is very effective for reaction of CO with $H_2$ to make methanol, and web provides very good thermal conductivity for improved temperature control. Activation can be confined to one face of web. Other self-supporting catalysts can be made similarly.

4 Claims, 1 Drawing Sheet

PROCESS OF PREPARING CATALYTIC BRASS

This application is a continuation-in-part of the following six prior patent applications: Ser. No. 359,212 filed Mar. 18, 1982 (U.S. Pat. No. 4,443,557 granted Apr. 17, 1984), Ser. No. 302,979 filed Sept. 17, 1980 and subsequently abandoned, Ser. No. 281,405 filed July 8, 1980 (U.S. Pat. 4,708,913 granted Nov. 24, 1987), Ser. No. 311,621 filed Oct. 15, 1980 and subsequently abandoned, Ser. No. 242,350 filed Mar. 10, 1980 (U.S. Pat. 4,464,430 granted Aug. 7, 1984), Ser. No. 172,671 filed July 28, 1980 (U.S. Pat. No. 4,434,481 granted Mar. 6, 1984).

All six are continuations-in-part of earlier applications Ser. Nos. 230,333 filed Feb. 2, 1980 (U.S. Pat. No. 4,347,267 granted Aug. 31, 1982) and 25,456 filed Mar. 30, 1979 (U.S. Pat. No. 4,349,612 granted Sept. 14, 1982), while the earliest three of those six are also continuations-in-part of Ser. Nos. 98,654 filed Nov. 29, 1979 (U.S. Pat. No. 4,290,391 granted Sept. 22, 1981) and 172,938 filed July 28, 1980 (subsequently abandoned), as is Ser. No. 230,333.

Ser. No. 172,938 is a continuation-in-part of Ser. Nos. 98,654 and 25,456 both of which in turn are continuations-in-part of Ser. Nos. 963,313 filed Nov. 24, 1978 (subsequently abandoned) and 752,855 filed Dec. 21, 1976 (U.S. Pat. No. 4,208,453 granted June 17, 1980); Ser. Nos. 25,456, 963,313 and 752,855 being also continuations in part of Ser. No. 694,951 filed June 11, 1976 (subsequently abandoned).

Ser. Nos. 963,313, 752,855 and 694,951 are in their turn continuations-in-part of Ser. No. 614,834 filed Sept. 19, 1975 (U.S. Pat. No. 4,141,760 granted Feb. 27, 1979), while Ser. Nos. 752,855, 694,951 and 614,834 are also continuations-in-part of Ser. No. 579,945 filed May 22, 1975 (subsequently abandoned).

Ser. Nos. 614,834 and 579,945 are continuations-in-part of Ser. Nos. 466,908 filed May 3, 1974 (U.S. Pat. No. 3,958,047 granted May 18, 1976) 446,473 filed Feb. 27, 1974 (U.S. Pat. No. 3,958,046 granted May 18, 1976), 404,665 filed Oct. 9, 1973 (U.S. Pat. No. 3,948,689 granted Apr. 6, 1976), 357,616 filed May 7, 1973 (U.S. Pat. No. 3,948,687 granted Apr. 6, 1976) and 304,220 filed Nov. 6, 1972 (U.S. Pat. No. 3,936,539 granted Feb. 3, 1976) while Ser. Nos. 466,908 and 446,473 are continuations-in-part of Ser. Nos. 404,665, 357,616 and 304,220.

Finally, Ser. Nos. 404,665, 357,616 and 304,220 are continuations-in-part of Ser. Nos. 254,403 filed May 18, 1972 (U.S. Pat. No. 3,785,854 granted Jan. 15, 1974), 219,514 filed Jan. 20, 1972 (U.S. Pat. No. 3,801,357 granted Apr. 2, 1974) and 90,682 filed Nov. 18, 1970 (U.S. Pat. No. 3,764,371 granted Oct. 9, 1973), Ser. No. 446,473 also being a continuation-in-part of Ser. No. 219,514, while 254,403 and 219,514 are also continuations-in-part of Ser. No. 90,682.

The present application is directed to catalysts suitable for use with chemical reactions.

Among the objects of the present invention is the provision of catalysts having very strong catalytic action.

The foregoing as well as other objects of the present invention will be more fully understood from the following description of several of its exemplifications, reference being made to the accompanying drawing.

Figure 1:
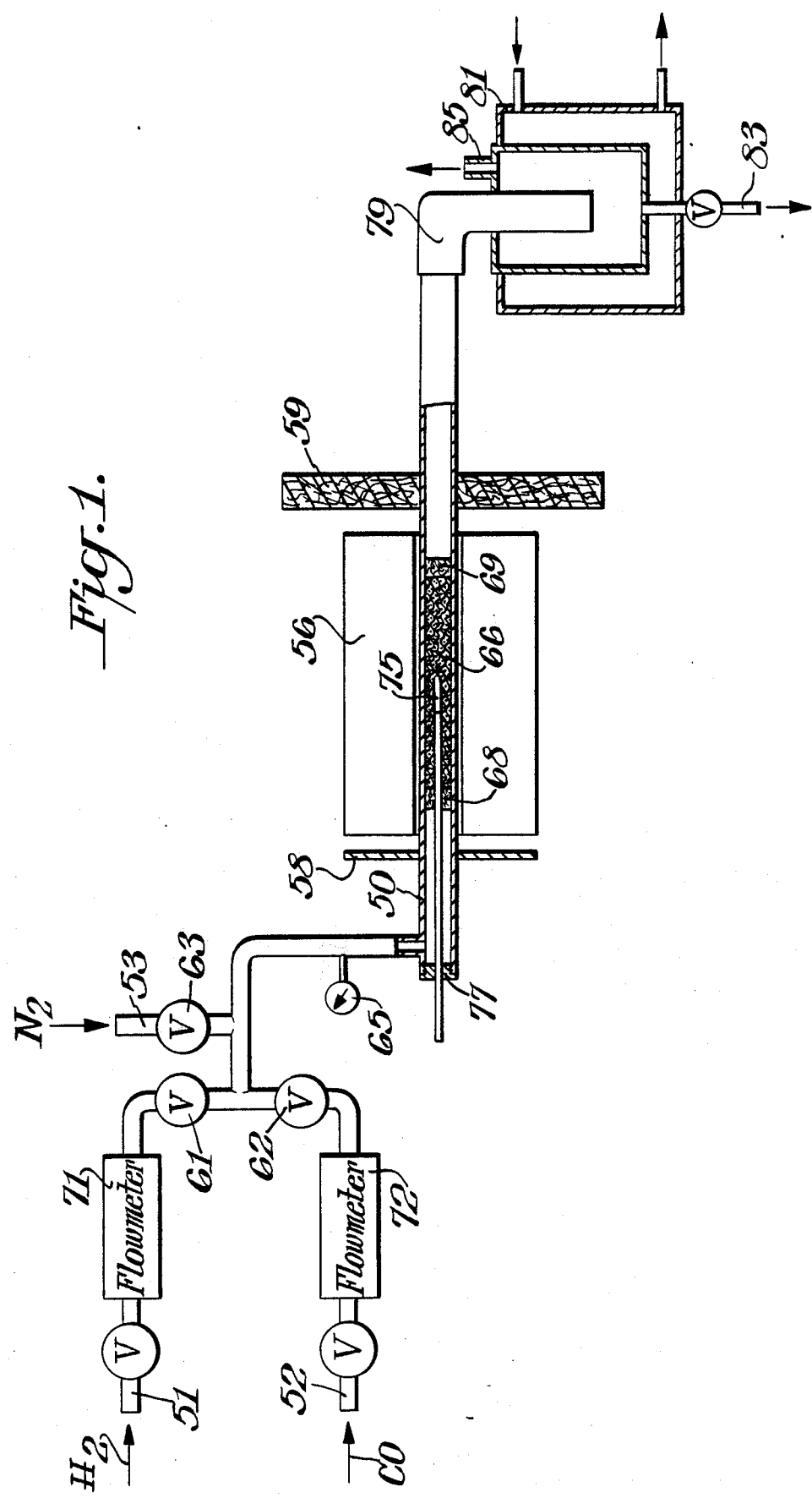
FIG. 1 is a diagrammatic representation of a methanation apparatus using a catalyst of the present invention.

As noted in some of the parent applications, many metallic catalysts show improved catalytic activity when they are activated by the technique illustrated in the examples set out in U.S. Pat. No. 4,154,705. Such technique involves the low-temperature diffusion into the surface of the catalytic metal, of a different metal that is subsequently leached out. The leachable metal is generally aluminum or zinc.

According to the present invention, catalytic brass such as that used in commercial methanol formation, is made more active by diffusing aluminum into its surface to bring its aluminum content to at least about 17% by weight, and then subjecting that surface to the leaching action of aqueous mineral acid to leach out a substantial amount of its zinc, along with much of the added aluminum. The leaching is best conducted hot, with acid not stronger than about 5% by weight, and stopped when the surface of the brass becomes dark brown showing that essentially all of the aluminum and zinc in the skin has been dissolved. If not deliberately stopped, the leaching will continue for several hours gradually slowing down to practically a standstill. At that point, no significant amount of copper has gone into solution, and the solution is still colorless even when the leaching acid is nitric acid. Equivalent leaching can be effected with cold acid as strong as about 10% by weight. At any stage after it first turns brown, the leached product is highly catalytic.

The resulting activated material causes very rapid decomposition of $H_2O_2$ when dropped into a 30 weight percent aqueous solution of that material, and when made from a brass containing 10 to 40 weight percent zinc is also a good catalyst for methanol production from CO and $H_2$.

FIG. 1 illustrates a typical small-scale methanol synthesis set-up for the above purposes. A high-pressure reactor tube 50 is connected to receive pressurized streams of $H_2$, CO and $N_2$ from branched inlets 51, 52 and 53 respectively. Valves 61, 62 and 63 are contained in the respective branch supply lines and flowmeters 71, 72 are inserted in branch inlets 51 and 52 to measure the flow of $H_2$ and CO. A pressure gauge 65 is preferably provided at or near the reactor tube inlet.

A tube-type electric furnace 56 is fitted over the reactor tube 50, and thermal shields 58, 59 placed at both ends of the furnace to help keep the remainder of the equipment from becoming excessively heated. A roll of catalytic screening 66 is inserted in a portion of the reactor tube within the furnace confines, and is held there with the help of glass wool plugs 68 and 69 that are wedged into place. Plug 68 is penetrated by the sensing end 75 of a thermocouple that extends into the screening 66 and is connected through a threaded cap 77 to an external thermocouple meter.

Reactor tube 50 is preferably a straight length so that catalyst can be easily inserted and removed. A threaded-on exit trap tube 79 can be fitted to the down stream and of the reactor tube to lead the fluids formed in the reactor tube into a jacketed cooling trap 81 where condensible fluids are collected and discharged through valved exit 83. Non-condensing fluids leave through gas outlet 85, and can be recirculated back to one of the illustrated inlet branches or to a separate inlet branch. The recirculated fluids can be subjected to a purification treatment before they are returned to the reactor inlet. Alternatively those fluids can be merely vented off.

The apparatus of FIG. 1 is put into use by first assembling it with the catalyst in place, purging its interior with nitrogen by opening valves 63 and 83 while valves 61 and 62 are kept closed, then starting the oven 56 and very gradually opening hydrogen valve 61 while closing valve 63, to bring the pressure to about 1500 160 psig. When the thermocouple reaches about 200° C., valve 62 is opened to introduce the pressurized CO. Where the catalyst has a heavily oxided surface, as for example because of a prior treatment with $H_2O_2$ or heating in air, the introduction of the CO is preferably delayed an hour or two to make sure any copper oxide is reduced to copper. The CO introduction causes the catalyst temperature to increase as a result of the methanol-forming reaction $CO + 2H_2 \rightarrow CH_3OH$, which reaction generates considerable heat. The oven can then be generally turned down or turned completely off, and the reaction controlled by adjustments of valves 61 and 62 to keep the catalyst temperature between about 200° and 450° C.

It is generally desirable to introduce the hydrogen into the reactor inlet in a proportion of somewhat more than two volumes for each volume of CO. This provides a stoichiometric excess of hydrogen that can be recycled along with unreacted CO.

Instead of supplying pure CO to inlet 52, commercial products such as synthesis gas can be used even though they contain some $CO_2$ and other ingredients. In the reactor tube any $CO_2$ present will be at least partially reduced to CO by the hydrogen. This causes water to form with the methanol that is produced. The progress of the methanation can be followed by bleeding part of the fluids emerging from outlet 85 to a gas chromatograph or the like that measures its CO and $CH_4$ contents. Too much $CH_4$ indicates the reaction temperature is too high, and too much CO indicates the reaction temperature is too low or the catalyst has been poisoned.

The following catalyst is suitable for the foregoing use.

EXAMPLE 1

An 80 by 80 mesh screen of 80:20 brass wire 5.5 mils thick is cleaned, dried and packed in aluminizing powder contained in a diffusion coating retort as described for platinum screens in Example XII of U.S. Pat. No. 4,154,705. Diffusion is conducted at 900° F. for ten hours as described in the patent's example, yielding a product with an off-white appearance that had a weight gain of about 4 milligrams per square centimeter of screen as measured with a ruler. That weight gain represented aluminum that had diffused into the surface of the screen wires to a depth of about 1.5 mils. The outermost skin of the aluminized case had an aluminum content of about 21%.

The aluminized screen was cleaned and then dropped into an excess of a hot (180° to 200° F.) solution of 2% $HNO_3$ in water. Bubbling commenced, showing that the screen was being attacked by the acid. After about one-half hour the bubbling slowed very sharply and the surface of the screen appeared dark brown rather than off-white. The resulting screen was then removed from the acid which was still colorless, washed, dried and weighed. It showed a weight loss of 8.69 milligrams per square centimeter, based on the weight of the aluminized screen. A test with cold 30% $H_2O_2$ showed vigorous $H_2O_2$ decomposition.

A 100 by 100 mesh screen of 80:20 brass wire 4.5 mils thick, aluminized at 850° F. for 12 hours and then leached with hot 1.5% $HNO_3$, gives very good methanol formation at 780° F. and 1500 psig from a stream of 80–85% hydrogen, 7% $CO_2$ the balance CO. Such an activated screen rolled up from a strip 1½ inches wide to make a tube having a 0.7 centimeter internal diameter and a 1.5 centimeter outer diameter that fits snugly into reactor tube 50, enables methanol formation with a space velocity of 50,000 per hour.

Instead of having the catalyst in the form of a screen, it can be made in the form of a sheet or tube. A tube of this kind can be used as the reactor for the methanol formation. A sheet of 70:30 brass 30 mils thick subjected to the activation described in the foregoing Example 1, but with diffusion coating temperature 50° F. higher, showed an aluminizing weight gain of 5.4 milligrams per square centimeter, and a leached weight loss of 9.75 milligrams per square centimeter, in 1.5 weight % $HNO_3$ in water. Its surface skin after aluminizing had an aluminum content even higher than that of the aluminized screen of Example 1. This sheet catalyst was also vigorously active against $H_2O_2$.

The catalyst can be impregnated with chromium oxide after leaching, as by momentarily dipping the leached material into an aqueous solution of chromic acid or ammonium chromate or dichromate and then heating the dipped product to drive off the water. A solution having at least 10% by weight $CrO_3$ is preferred for the dipping. When such an impregnated catalyst is subjected to the action of hydrogen at elevated temperatures, some of the chromium oxide is reduced to lower oxides and to metallic chromium. A chromium nitrate dip followed by drying at elevated temperatures, is also helpful.

Brasses that contain a few percent silicon, tin and/or manganese such as Admiralty brass, manganese brass and manganese bronze, can be substituted for the foregoing brasses.

Zinc-free copper and bronzes such as phosphor bronze which contains up to about 10% tin can also be activated by the foregoing aluminizing and leaching sequence, although here the weight loss on leaching is less than the weight gain on aluminizing. Copper activated in this way is also catalytic and causes vigorous decomposition of 30% $H_2O_2$.

The leaching acids of the present invention do not give adequate attack at low temperature—below about 100° F. They also show very little attack on untreated copper or untreated brass or on aluminum at elevated temperatures. The leaching action is accordingly considered as depending upon the electrolytic relationship between the aluminum and the copper or the aluminum and the zinc, in the aluminized metals. An aluminum content in the surface skin after diffusion aluminizing should not be over about 35 to 40% by weight.

Temperatures as low as about 625° F. can be used for effective aluminizing, but the diffusion times should then be at least about 20 hours.

Such diffusion-aluminized brasses, bronzes and copper, are attacked by strong aqueous NaOH. Thus 20% by weight aqueous caustic soda will even at room temperature as well as at temperatures as high as 210° F., causes bubble formation when contacted by any of the forgoing aluminized materials. Although this bubble formation shows that something is being attacked, the aluminized surfaces after an hour of such attack do not turn dark brown and show very little catalytic action as determined by their effect on $H_2O_2$. The preference for caustic leach expressed by L. Faucounau in Bull. Soc. Chim. Fr. 1937—pp. 58–62, and the drop in catalytic activity suggested in British Patent Specification 1,170,698 for simple acid leaching, is apparently not applicable. A preference for acid leaching of platinum-copper alloys is indicated in U.S. Pat. No. 2,384,501.

For use as a reactor tube, 73:27 brass pipe, having an outside diameter of 0.675 inch and a wall thickness of about 0.25 inch, is diffusion aluminized on its internal surface, using a fluent diffusion coating pack and capping the pipe ends as described in U.S. Pat. No. 4,327,134. The aluminum content of the pack is 30 weight %, the content of energizer ($AlCl_3$) ¾ weight %, and the diffusion time is extended to sixteen hours.

After aluminizing the internal skin of the pipe has over 20% aluminum, and is leached with aqueous 3.5 weight % $HNO_3$. It is then rinsed, cleaned, and used for the reactor tube 50 of FIG. 1. A feature of such use is that the excellent thermal conductivity of such a pipe greatly improves the temperature control of the methanol-forming reaction. The large amounts of heat generated by the methanol formation is so rapidly carried away that the throughout rate of reacting gases can be significantly increased. Inasmuch as such a pipe has a substantial internal diameter, high throughputs are best obtained when the pipe's interior is at least about five to ten inches long so that its catalytic surface is correspondingly enlarged.

A similar but smaller thermal conductivity can be obtained with activated sheet brass catalysts rolled into cylindrical configuration and inserted in coaxial relation in the interior of a separate metal reactor tube in which they are closely fitted. Only the internal faces of the cylindrically curved brass sheets are activated, and the activation can be effected before or after the sheets are cylindrically shaped.

Heat control with the brass or metal reactor pipe is also facilitated by fitting such a pipe with an encircling heat-exchange jacket and circulating a heat-exchange liquid through the jacket. Such a circulating liquid, a silicone oil for example, can be externally heated and passed hot through the heat exchanger to heat up the reactor tube for starting up the reaction, and when the reaction gets under way the heat exchange liquid can be externally cooled before it is introduced into the heat-exchange jacket. Because the active catalyst surface in the forgoing constructions is in very good thermally conductive contact with the outside of the reactor tube, the liquid in the heat-exchange jacket does a good job of heating and cooling that surface, even when the catalyst is an activated rolled-up screen, or a piece of activated brass wool or sponge, tightly fitted inside the reactor tube.

It is also possible to effect good heat control by conducting the methanol-forming reaction in a liquid base, as by bubbling the reactants through a body of liquid cyclohexanol in contact with the cupreous catalysts of the present invention. The liquid provides good heat-exchange contact with the walls of the container in which the liquid is held, and those walls can be part of a heat-exchanger.

Very good catalytic activity is also obtained when the zinc content on the surface skin of the catalyst is kept up at a level of at least about 1 to 10% by weight. This is readily effected by adding metallic zinc to the pack in which the aluminum diffusion is performed. As little as 1 part zinc to 10 parts aluminum by weight, in the pack provides a significant increase, but as much as 40 to 50 parts zinc per 100 parts aluminum, by weight can be used. High zinc concentrations in the pack tend to keep the brass from turning brown when leached. The leaching is then best controlled by timing. Generally a half-hour dilute acid leach at 170° F. or higher is very effective but as little as 10 minutes at those temperatures provides good results.

Hydrochloric acid, sulfuric acid, and phosphoric acid also accomplish the activation of the brass, but they leave some residual anions that appear to stubbornly resist rinsing operations. Such residual chloride or sulfate ions can have an adverse effect on methanol formation, whereas residual nitrate ions appear to have no significant deleterious effect. If desired, however, the activated brass surface can be heated to about 250° C. to decompose residual nitrate, before preparing the equipment for the methanol formation.

Acetic acid does not significantly leach anything from the aluminized brass. It can be added to any of the above-noted mineral acid leaching solutions in amounts as high as 20 times that of the mineral acid without noticeably modifying the leaching action.

Aqueous ammonium persulfate solutions in strengths of from about 3 to about 10% by weight also do a good job of leaching the brass catalysts of the present invention, particularly when the solutions are at temperatures above about 80° C. However ammonium persulfate has a strong tendency to also leach out some copper after the actiated surface turns dark brown, and it is best to watch the leaching after the first five minutes, so that it can be terminated before a significant amount of copper is leached out. Stronger and even saturated solutions of ammonium persulfate can also be used but have to be watched more closely, particularly when they are used hot. A hot water solution of picric acid is also an effective leaching agent.

The activated brasses of the present invention become noticeably pyrophoric when heated to about 300° F., if the activated surface layer is at least about 0.2 mil thick. Such an activated brass in which the non-activated thickness is not over about 10 times that of the activated layer, has a pyrophoric activity sufficiently strong to heat the brass to red heat.

The foregoing activation of brass can also be used to activate other catalysts such as the nickel-cobalt-molybdenum catalyst used for the hydrogen-reduction of CO to methane.

The activation treatment of the present invention can be conducted with portions of the catalyst web masked so that no diffusion takes place at those portions. Thus the outer surface of the brass pipe for the construction of FIG. 1 can be so masked using masking compositions analogous to those shown in the prior applications. Such composition can also be applied in the form of pastes that do not flow and can be squeezed out of a syringe or collapsible tube like toothpaste. Thus into a solution of 9 grams of acrylate resin such as poly(ethylmethacrylate) in 100 cc methyl chloroform is stirred 2 grams of colloidal silica particles having a surface area of about 200 square meters per gram. 100 grams of a mixture of finely divided brass and powdered alumina, in a 1:2 weight proportion is then stirred into the resulting thickened solution to form a paste that can be dispensed from a syringe fitted with a No. 13 needle having an internal bore about 60 mils in diameter. The brass should have a composition approximating that of the pipe.

The paste is dispensed directly onto the workpiece surface to be masked and remains in place. Accurate boundaries for a masked area of any contour are easily followed by such a technique. Moreover, the desired amount of masking mixture can be applied as a single layer of paste that can be as much as 60 mils thick, so that multiple dipping as described in Ser. No. 242,350 is not needed. Even thicker layers can be applied by using needles with larger bores, or by extruding the paste through a toothpaste tube. In general a paste thickness of at least about 10 mils is preferred.

Where two or more layers of different masking compositions are used one above another, as described in Ser. No. 242,350, corresponding layers of suitably formulated paste can be used. Thus the foregoing powdered brass masking layer can be covered by a layer of $Ni_3Al$ or nickel, with or without a refractory diluent such as alumina.

The extruded pastes lose much of their volatile solvent on standing a few minutes, and this evaporation changes the pastes to very hard layers that withstand the mechanical treatment needed to embed the masked workpieces in a diffusion coating pack. For this purpose at least about 95% of the liquid content of a paste should be volatilizable within about 5 minutes after the paste is extruded.

Other thickening agents can be used, as well as other solvents and other resins, to make the pastes. To make an article of commerce the pastes are desirably formulated with the masking powder in one container, and the balance of the paste in another, so that the purchaser can mix them together fresh for use. A pre-mixed masking-powder-containing paste can be subject to settling over very long periods of time inasmuch as some of the powder is a metal of high specific gravity.

Diffusion coating packs in which the pack particles are very small, are particularly suited for diffusion coating the interiors of hollow articles. Some types of such interior coating are described in U.S. Pat. No. 3,936,539, and others in parent application Ser. No. 230,333, now U.S. Pat. No. 4,347,267. The entire contents of that parent application are hereby incorporated in the present specification as though fully set forth herein.

Obviously many modifications and variations of the present invention are possible in the light of the above teachings. It is therefore to be understood that within the scope of the appended claims the invention may be practiced otherwise than as specifically described.

I claim:

1. The process of preparing catalytic brass, which process is characterized by diffusing aluminum into the surface of a self-supporting brass web that contains about 10 to about 40% zinc, to cause the surface to pick up enough aluminum so that its aluminum content is at least about 17% by weight, and then subjecting the aluminized surface to the leaching action of aqueous mineral acid that leaches out much of the aluminum without significantly attacking the copper, and continuing the leaching at least until the leached surface becomes dark brown in color.

2. The process of claim 1 in which the mineral acid is nitric acid.

3. The process of preparing catalytic brass, which process is characterized by diffusing aluminum into the surface of a self-supporting brass web that contains about 10 to about 40% zinc, to cause the surface to pick up enough aluminum so that its aluminum content is at least about 17% by weight, and then subjecting the aluminized surface to the leaching action of aqueous ammonium persulfate to dissolve much of the aluminum without significantly attacking the copper, and continuing the leaching until the leached surface becomes dark brown in color.

4. The product produced by the process of claim 2.

* * * * *